United States Patent [19]

Choi et al.

[11] Patent Number: 5,045,494

[45] Date of Patent: Sep. 3, 1991

[54] METHOD FOR MANUFACTURING A DRAM USING SELECTIVE EPITAXIAL GROWTH ON A CONTACT

[75] Inventors: Do-chan Choi; Kyung-tae Kim, both of Seoul, Rep. of Korea

[73] Assignee: Samsung Electronics Co., Ltd., Rep. of Korea

[21] Appl. No.: 494,185

[22] Filed: Mar. 15, 1990

[30] Foreign Application Priority Data

May 10, 1989 [KR] Rep. of Korea .................. 89-6206

[51] Int. Cl.$^5$ .................. H01L 21/72; H01L 21/20
[52] U.S. Cl. .................. 437/60; 437/89; 437/90; 437/193; 437/919; 148/DIG. 26
[58] Field of Search .................. 437/89, 90, 99, 193, 437/919; 148/DIG. 26, DIG. 14

[56] References Cited

U.S. PATENT DOCUMENTS 4,578,142  3/1986  Corboy, Jr. et al. ....... 148/DIG. 26
4,700,457  10/1987 Matsukawa ............... 148/DIG. 14

FOREIGN PATENT DOCUMENTS 0037829  3/1982  Japan ....................... 437/89
0016340  1/1984  Japan ....................... 437/89
0105227  6/1985  Japan ....................... 437/89

OTHER PUBLICATIONS

Wolf, Silicon Processing for the VLSI Era, vol. 1, pp. 155-156, 1986.

Primary Examiner—Brian E. Hearn
Assistant Examiner—C. Chaudhari
Attorney, Agent, or Firm—Cushman, Darby & Cushman

[57] ABSTRACT

A method for manufacturing a semiconductor device includes forming contact holes in insulating layers to expose an impurity doped region of a semiconductor substrate. An epitaxial layer is then grown in the contact hole. A polycrystalline silicon layer is formed over the top to provide the lower electrode of a capacitor. Accordingly, the polycrystalline layer is separated from the impurity doped region thereby preventing current leakage.

15 Claims, 9 Drawing Sheets

METHOD FOR MANUFACTURING A DRAM USING SELECTIVE EPITAXIAL GROWTH ON A CONTACT

FIELD OF THE INVENTION

The present invention relates to a manufacturing method for a semiconductor device, and particularly to a manufacturing method for a semiconductor device having an epitaxial layer selectively grown on the contact portion of a semiconductor substrate to improve the reliability of the semiconductor device.

BACKGROUND AND RELATED ART

With the progress of microtechnology in the semiconductor manufacturing field, the physical dimensions of semiconductor devices are becoming increasingly smaller. As these devices become smaller, the contact area has been reduced to dimensions below 1 μm. However, due to the reduction of the contact area, contact resistance increases. Further, a step coverage defect may occur at the stepped portion due to a high aspect ratio, which is caused by microscale processing.

Meanwhile, since dynamic RAM semiconductor devices are being manufactured in densities of mega-bit order, various capacitor structures have been proposed to obtain sufficient capacitances in a limited space. Particularly, in the semiconductor devices of a 4Mbit scale, a stacked capacitor (STC) structure is generally used because it is simple to manufacture and it has a high immunity against soft errors.

The conventional STC has a capacitor structure stacked on an access transistor which is formed on a semiconductor substrate. The capacitor consists of a storage node (i.e., a lower electrode), a dielectric film and an upper electrode. The storage node contacts the source (diffused or ion-implanted region) of the access transistor and usually is formed of polycrystalline silicon doped with an impurity.

However, the conventional STC has several drawbacks. First, the defects of the polycrystalline silicon are distributed over the source (doped region), which cause current leaks at the contact portion. Accordingly, the reliability of the semiconductor device is reduced. Further, the conventional STC has a structural characteristic wherein its capacitance decreases as its density increases. As a result, 4Mbit devices form a limit in conventional semiconductor manufacturing techniques.

Therefore, to manufacture a 16Mbit or a 64Mbit device, the limited space must be utilized more effectively. Accordingly, multi-layer structures, built in the upward direction above the substrate, or in the downward direction in a trench etched in the substrate, have been proposed to increase the effective total area of the capacitor. However, in the case where a multi-layer structure is formed in the upward direction, the contact hole of the drain (doped region) of the access transistor is deepened, thereby making it difficult to contact a bit line to the drain (diffused or ion-implanted region).

SUMMARY OF THE INVENTION

The present invention is intended to overcome the above described disadvantages of the conventional techniques.

Therefore, it is an object of the present invention to provide a method for manufacturing a semiconductor device which solves the problems arising from the increasingly reduced dimensions of the semiconductor contact portion.

It is another object of the present invention to provide a method for manufacturing a dynamic cell semiconductor device wherein electric current leakage from the contact portion between the access transistor and the capacitor is effectively eliminated.

In achieving the above objects, the method for manufacturing a semiconductor device according to the present invention includes selectively doping an impurity into the surface of a semiconductor substrate. An insulating layer is deposited and selectively etched to form a contact hole through which an area of the impurity-doped region is exposed. An epitaxial layer is then grown using the exposed surface of the impurity doped region as a seed. Finally, a conductive layer is deposited upon the epitaxial layer.

The conductive layer is made of a polycrystalline silicon formed upon the impurity doped region and is applicable to all contacting type semiconductor devices.

BRIEF DESCRIPTION OF THE DRAWINGS

The above objects and other advantages of the present invention will become more fully apparent by the following description of the preferred embodiment of the present invention with reference to the attached drawings in which.

DETAILED DESCRIPTION OF THE PREFERRED EMBODIMENT

Figure 1:
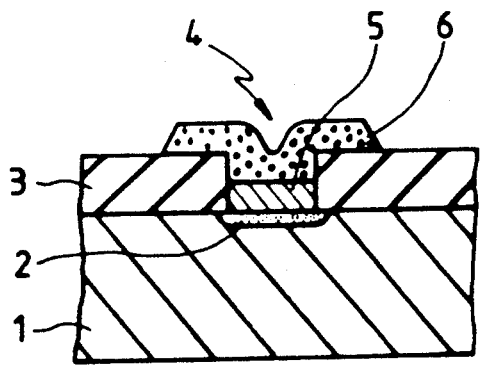
FIG. 1 is a sectional view of the semiconductor device according to the present invention.

FIG. 1 is a sectional view showing an embodiment of the semiconductor device according to the present invention. A diode (for example, a PN-coupled diode) is illustrated wherein a second conduction type (for example, N+ type) impurity-doped region 2 is coupled to a first conduction type (for example, P type) semiconductor substrate 1. An insulating layer 3 (for example, an $SiO_2$ layer) is formed on the semiconductor substrate 1, and contact hole 4 is formed therein in the impurity-doped region 2. An epitaxial layer 5 is provided within the contact hole 4 and a conductive layer 6 (i.e., a polycrystalline silicon layer) is formed upon the epitaxial layer 5.

In the above described structure, crystal defects of the conductive layer 6 are prevented from contacting the impurity-doped region 2 due to the epitaxial layer 5.

Therefore, current leakage, as seen in conventional devices, is prevented.

Figure 2B:
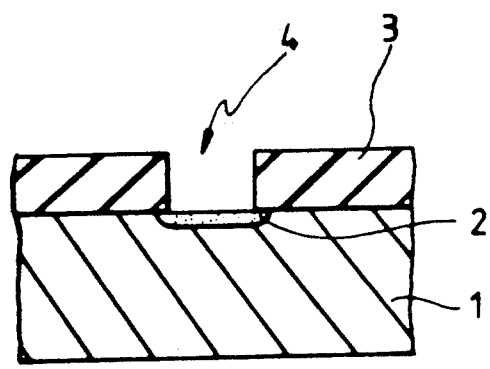
FIGS. 2A to 2D are sectional views showing the manufacturing process of the semiconductor device of FIG. 1.
Figure 2C:
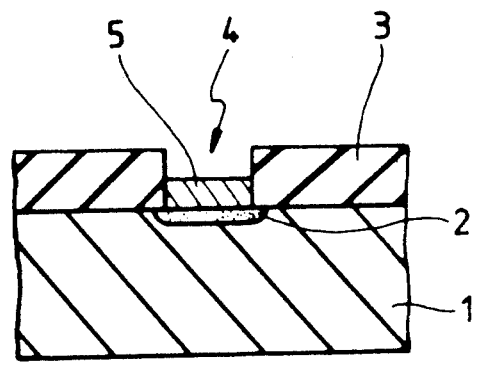
Figure 2A:
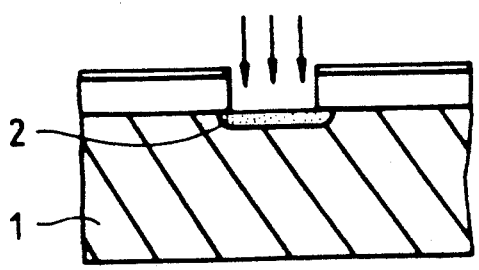

FIGS. 2A to 2D are sectional views showing the manufacturing process for the semiconductor device having the above described structure. In FIG. 2A, an N+ type impurity is selectively doped via a doping mask into a region 2 of the surface of a P type semiconductor substrate 1. After doping, the doping mask is removed and an insulating layer 3 is deposited on substrate 1 as illustrated in FIG. 2B. A contact hole 4 is then formed by selectively removing via a contact mask a part of the insulating layer 3 formed on the impurity-doped region 2.

As shown in FIG. 2C, an epitaxial layer 5 is grown via a chemical vapor deposition method (CVD) using the surface of the exposed impurity doped region 2 as a seed.

Figure 2D:
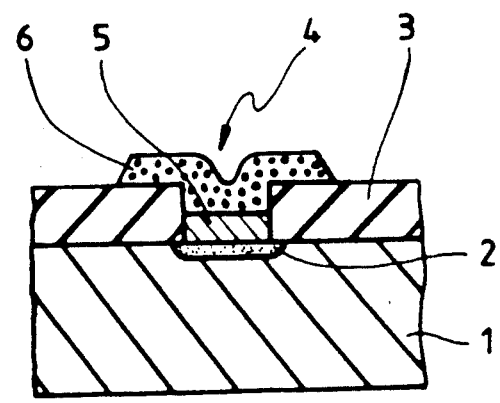

In FIG. 2D, a conductive layer 6 (e.g., a polycrystalline silicon layer) is formed and patterned above the epitaxial layer 5. The conductive layer 6 can be formed almost simultaneously with the epitaxial layer 5 by lowering the selection ratio.

The method of the present invention is preferably applicable to the manufacturing of a dynamic RAM. As the density of the dynamic RAM increases, the memory cell region is proportionally narrowed, and the contact area reduced. In conventional devices, the contact hole has a deep depth and a narrow cross sectional area, contributing to the problems discussed above.

However, according to the method of the present invention, the epitaxial layer is grown from the interior of the contact hole. As a result, contact failure is eliminated and the height of the step of the contact portion is considerably reduced, thereby improving the reliability and the manufacturing yield of the dynamic RAM. Further, given the improvements of the present invention, the contact size is reduced.

Several different embodiments of the manufacturing method for several modified capacitor structures of the dynamic RAM will now be described with reference to FIGS. 3 to 6.

EXAMPLE I

FIGS. 3A to 3I are sectional views showing a method for manufacturing a stacked capacitor type dynamic RAM semiconductor device according to the present invention.

Figure 3A:
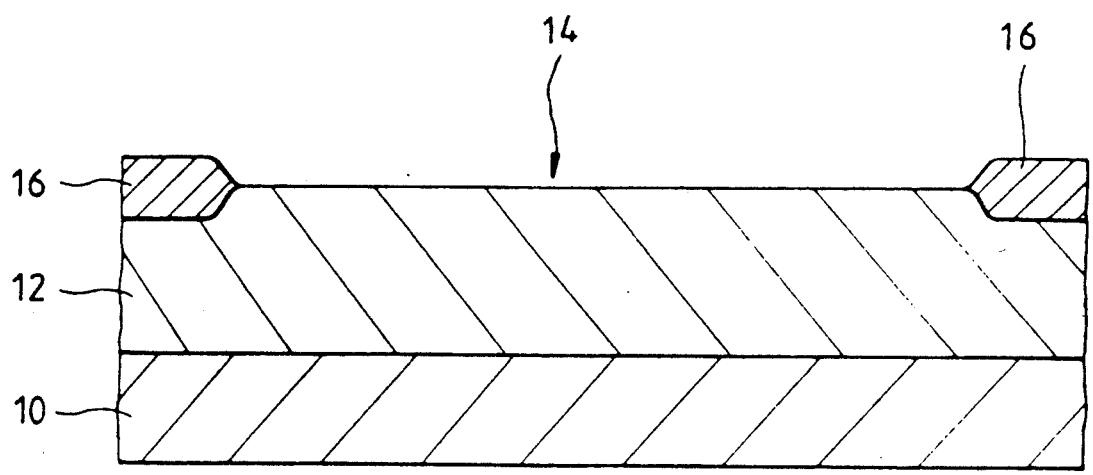
FIGS. 3A to 3I are sectional views showing the manufacturing process of the stacked capacitor type dynamic RAM semiconductor device according to the present invention.

As shown in FIG. 3A, a P type well 12 is formed on a semiconductor substrate 10. A field oxide layer 16 is formed according to the LOCOS (local oxidation of silicon) method to define an active region 14. Although not shown, a P+ channel stopper layer may also be formed under the field oxide layer 16.

Figure 3B:
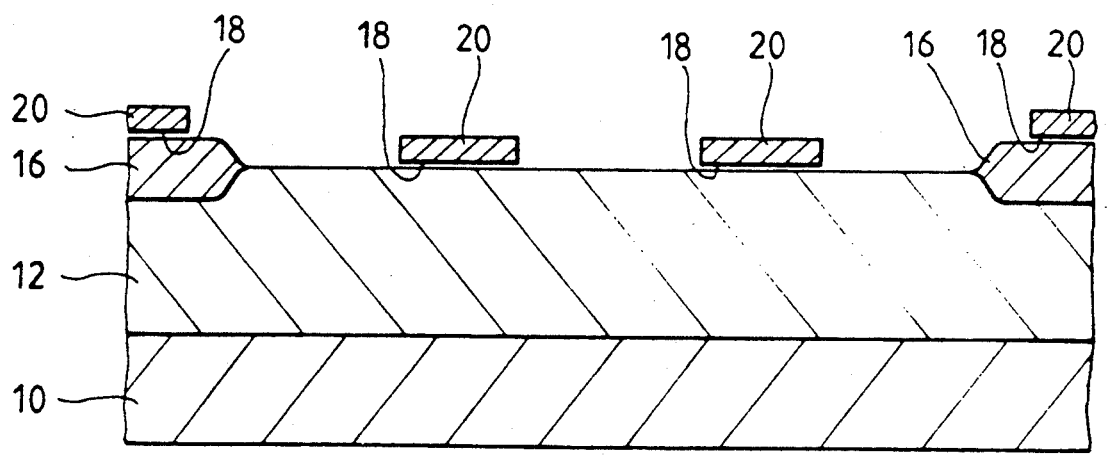

In FIG. 3B, a gate oxide layer 18 is provided, followed by a depositing of a first conductive layer 20 of polycrystalline silicon. The first conductive layer 20 is deposited in a pattern to define a gate electrode of the access transistor or a word line. In this Figure, the first conductive layer 20 formed upon the field oxide layer 16 is a word line connected to the gate electrode disposed between the adjacent cells.

Figure 3C:
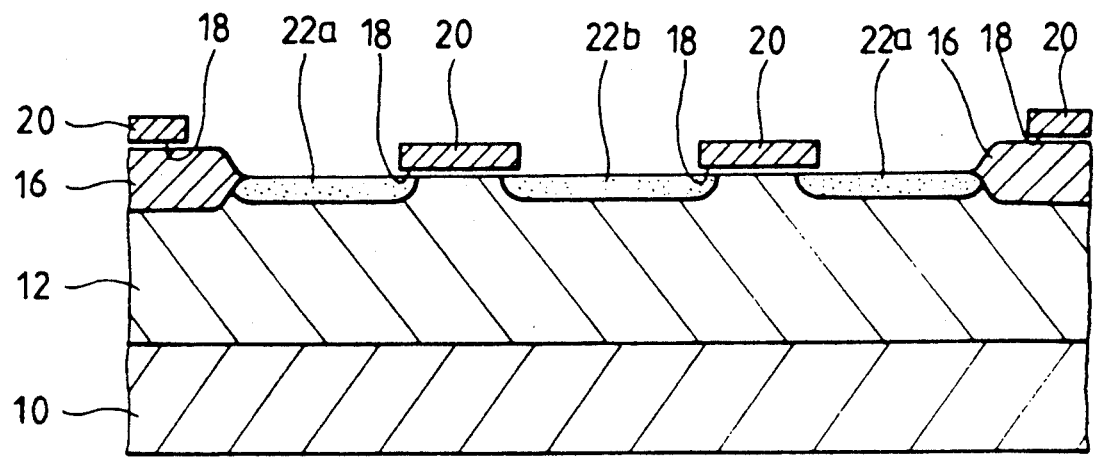

As illustrated in FIG. 3C, source and drain regions 22a, 22b of the access transistor are formed by doping the active region 14 of well 12 with an N+ type impurity according to ion implantation or diffusion methods. The field oxide layer 16 and the pattern of the first conductive layer 20 are employed as a mask to help define these regions 22a, 22b.

Figure 3D:
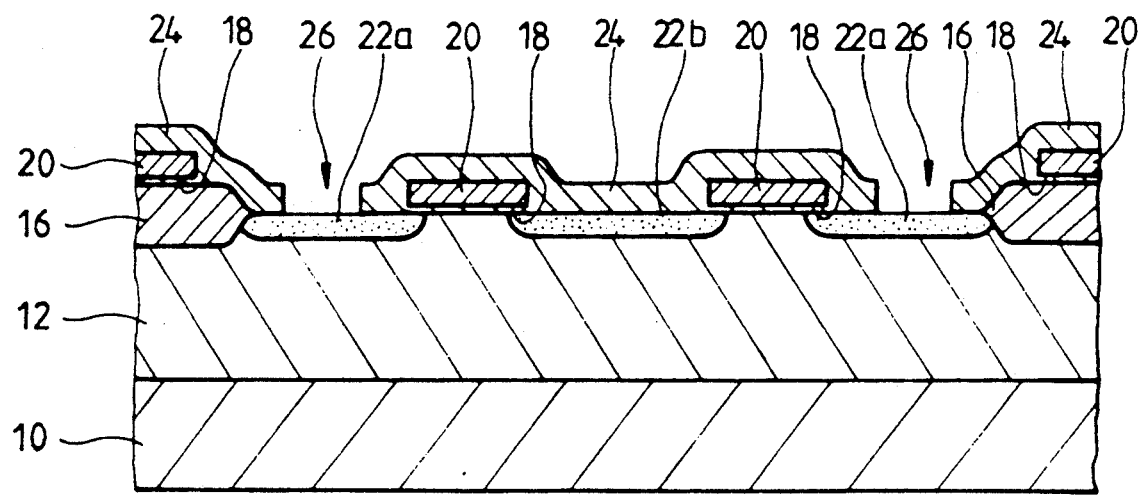

In FIG. 3D, a first insulating layer 24 is formed via the CVD process. The first insulating layer 24 is then selectively etched on the source region 22a, thereby forming a first contact hole 26 (i.e., a buried contact hole).

Figure 3E:
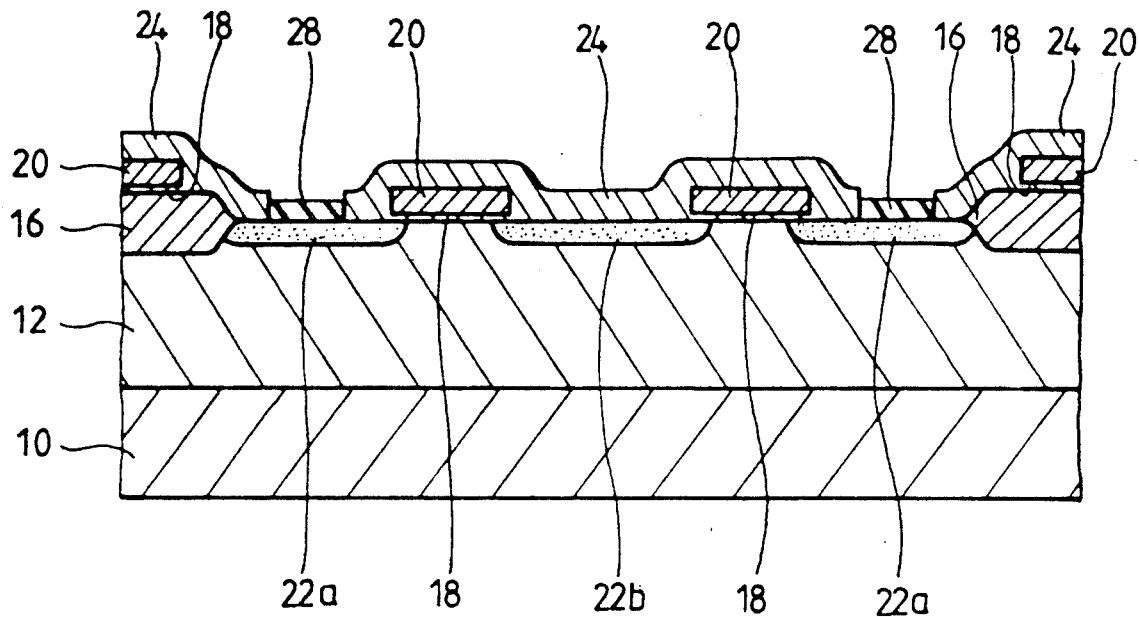

As shown in FIG. 3E, an epitaxial layer 28 is grown through the first contact hole 26 using the substrate surface of the source region 22a as a seed.

Figure 3F:
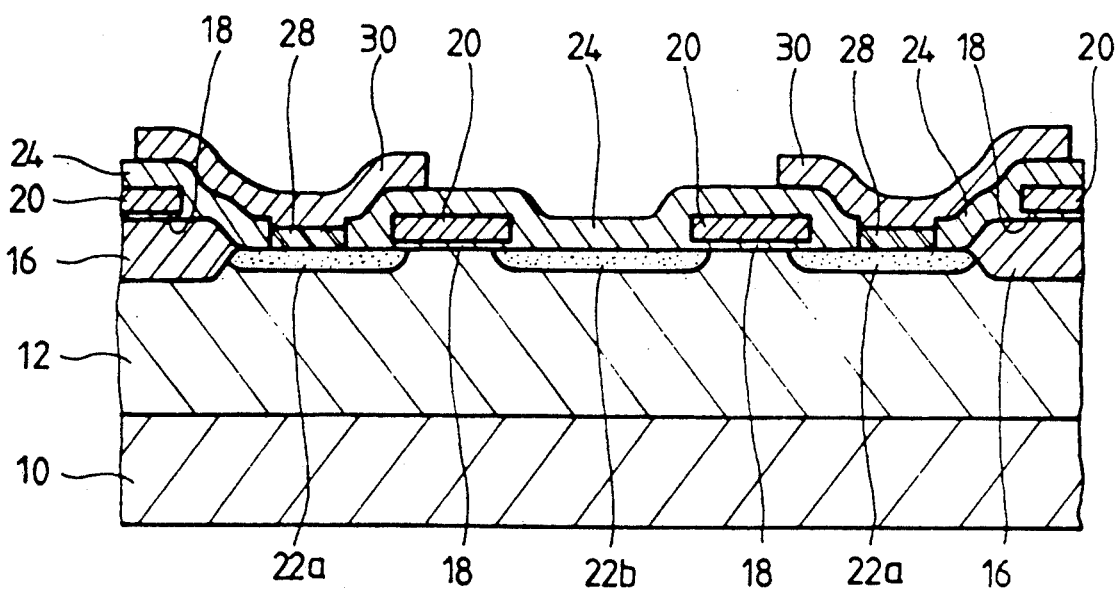

In FIG. 3F, a second conductive layer 30 (i.e., a polycrystalline silicon layer) is formed upon the whole surface of the epitaxial layer 28 and the first insulating layer 24. The second conductive layer 30 is doped with an N+ type impurity and then patterned as the lower electrode of the cell capacitor through the use of a photo-etching process.

Figure 3G:
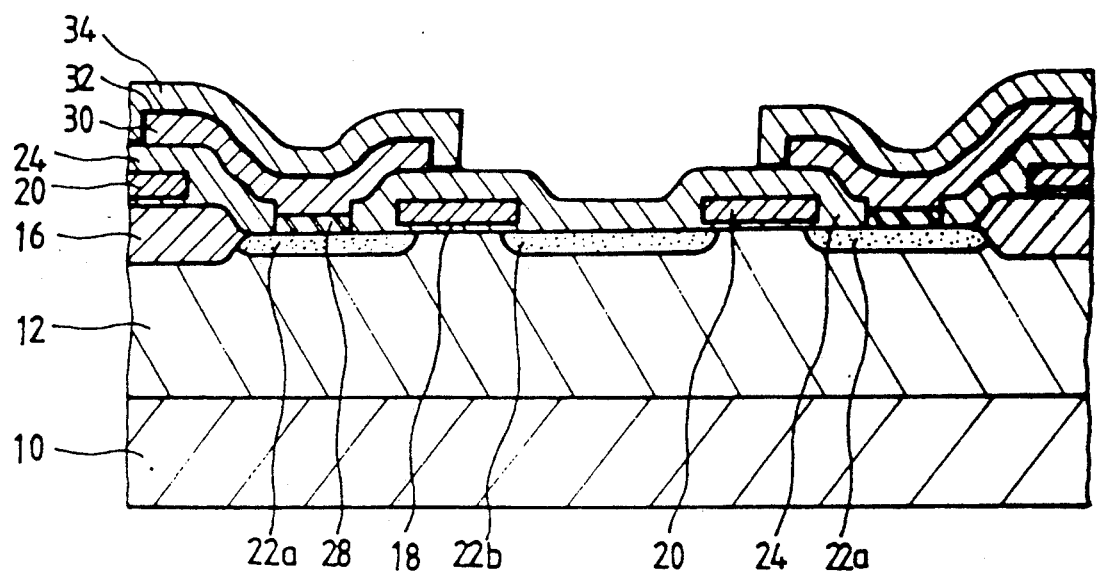

As illustrated in FIG. 3G, a dielectric layer 32 (i.e., ONO layer (oxide layer/nitride layer/oxide layer)) is formed on the whole surface of the second conductive layer 30 and the first insulating layer 24. A third conductive layer 34, (i.e., a polycrystalline silicon layer) is formed upon the dielectric layer 32 and then doped with an N+ type impurity via an ion implanting process or a POCL doping process. The dielectric layer 32 and the third conductive layer 34 are simultaneously etched to the illustrated pattern through the use of a photo-etching process. The third conductive layer 34 defines the upper electrode of the cell capacitor.

Figure 3H:
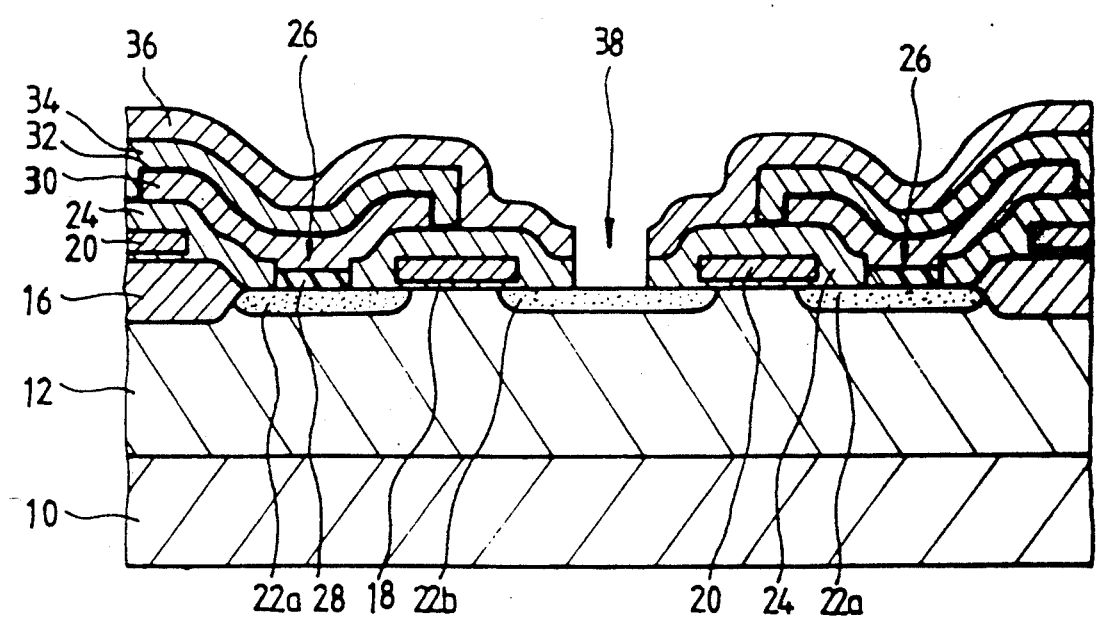

In FIG. 3H, a second insulating layer 36 (i.e., an oxide layer) is formed by a CVD process. The first and second insulating layers 24, 36 formed upon the drain region 22b are selectively etched to form a second contact hole 38 (i.e., a direct contact hole).

Figure 3I:
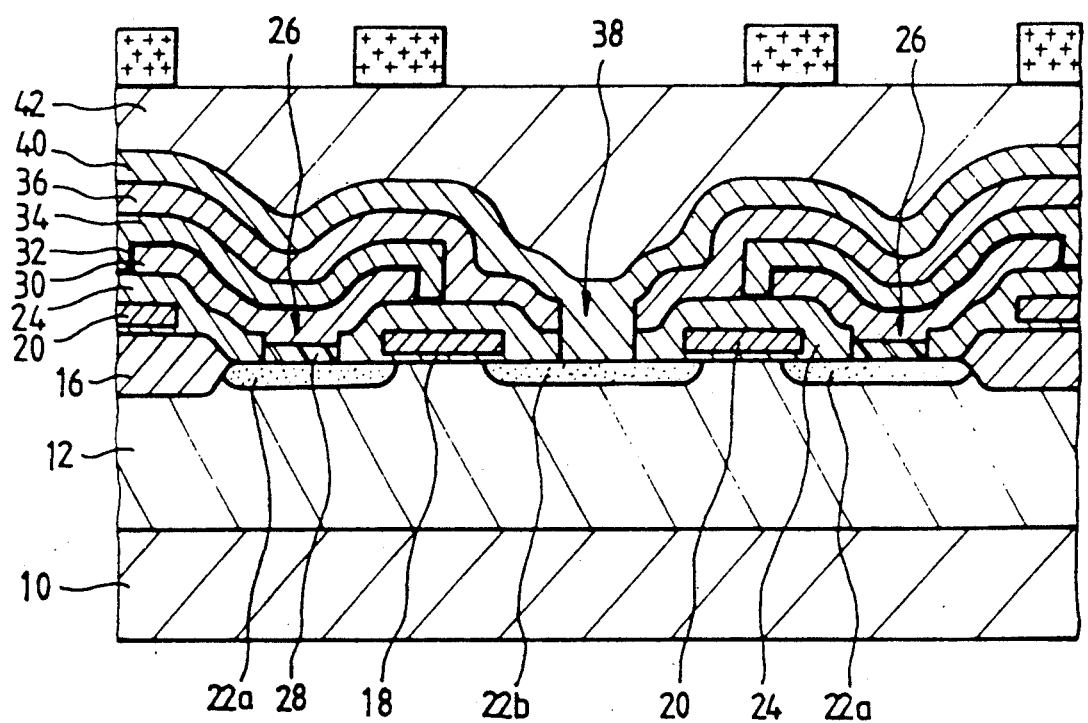

In FIG. 3I, a fourth conductive layer 40 (i.e., a polycrystalline silicon layer) is deposited on the whole face immediately following the formation of the contact hole, and doped with an N+ type impurity. The fourth conductive layer 40 is patterned in bit lines. Thereafter, a flattening layer 42 (e.g., a BPSG (borophosphorosilica glass) layer) is deposited.

EXAMPLE II

Figure 4A:
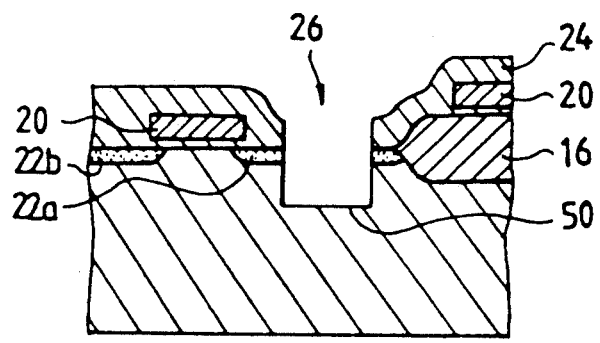
FIGS. 4A to 4C are sectional views showing a part of the manufacturing method for the combined stack-trench capacitor-type dynamic RAM semiconductor device according to a preferred embodiment of the present invention.
Figure 4B:
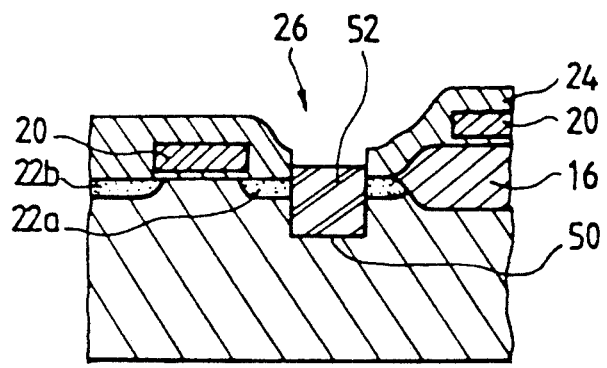
Figure 4C:
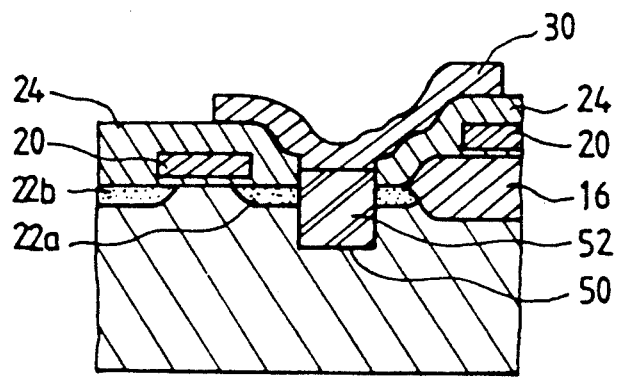

FIGS. 4A to 4C are sectional views showing a method for manufacturing the stack-trench combination capacitor type dynamic RAM semiconductor device according to the present invention. The descriptions of the steps identical to those of Example I are omitted.

In FIG. 4A, the substrate is etched through the first contact hole 26 to a depth of several hundred nm to several μm to form a trench 50. This etching step occurs after the formation of the first contact hole 26 described in FIG. 3D.

As shown in FIG. 4B, an epitaxial layer 52 is grown down into the contact hole 26, using the semiconductor substrate of the interior of the trench 50 as a seed. Accordingly, a pattern of a lower electrode of the capacitor (i.e., second conductive layer 30) is obtained as shown in FIG. 4C.

EXAMPLE III

FIGS. 5A to 5D are sectional views showing a part of the manufacturing method for a modified stacked capacitor type dynamic RAM semiconductor device according to the present invention. Again duplicative steps illustrated in Example I are omitted.

Figure 5A:
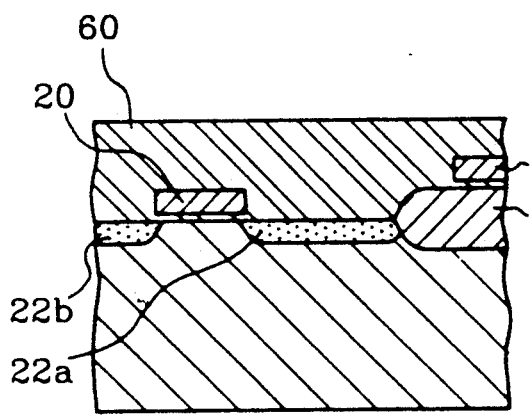
FIGS. 5A to 5D are sectional views showing a part of the manufacturing process for a modified stacked capacitor type dynamic RAM semiconductor device according to the present invention.

In FIG. 5A, a thick first insulating layer 60 (i.e., a BPSG layer) is formed after the formation of the first conductive layer 20 as illustrated in FIG. 3B.

Figure 5B:
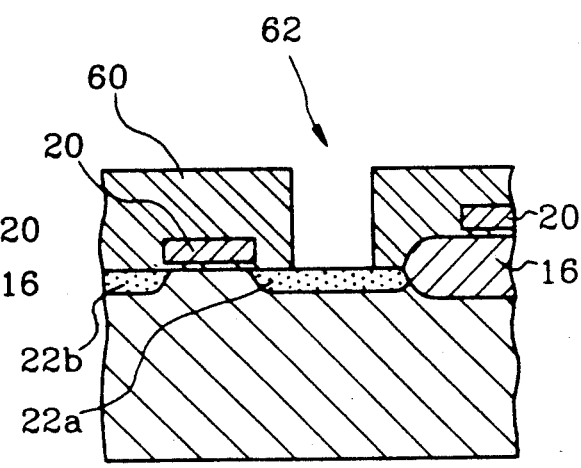

A first contact hole 62 is selectively etched in the flattened first insulating layer 60 in the source region 22a as shown in FIG. 5B.

Figure 5C:
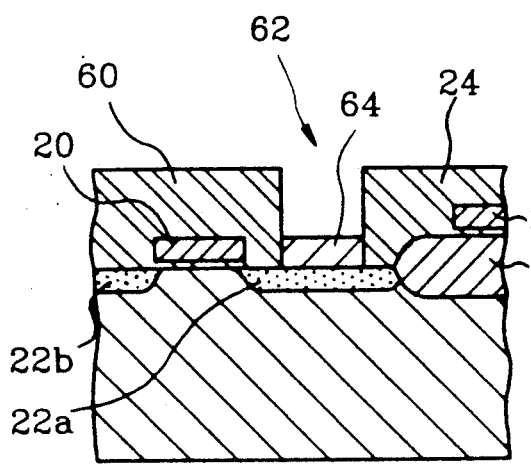

In FIG. 5C, an epitaxial layer 64 is grown using the substrate surface of the exposed source region 22a as a seed.

Figure 5D:
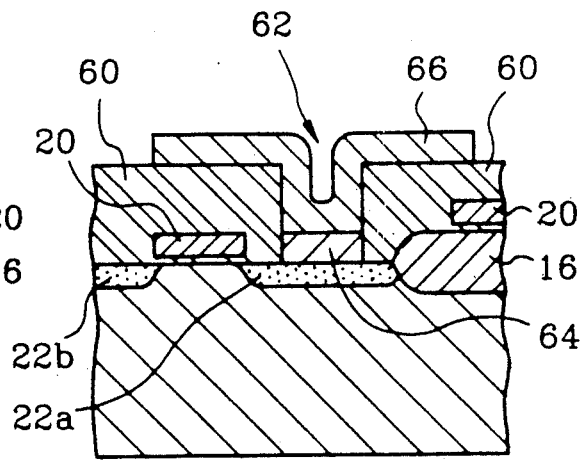

According to this embodiment in Example III, since the first contact hole 62 is formed by thickly flattening the first insulating layer 60, a second conductive layer 66 of a depressed capacitor has a lower electrode pattern as shown in FIG. 5D. The total area of the cell capacitor is expanded through the utilization of the first contact hole 62, thereby obtaining a sufficient cell capacitance.

EXAMPLE IV

FIGS. 6A to 6D are sectional views showing a part of the method for manufacturing a modified stacked capacitor type dynamic RAM semiconductor device according to the present invention. Duplicative steps are omitted.

Figure 6A:
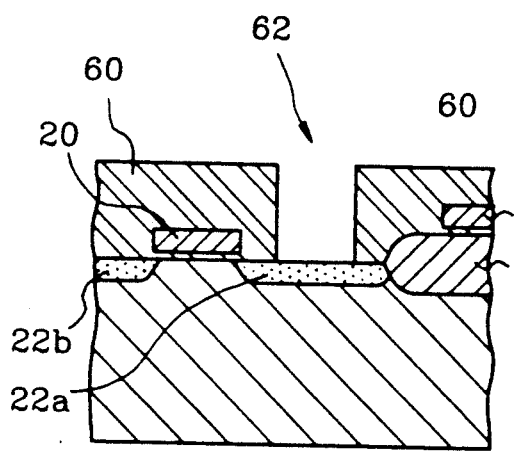
FIGS. 6A to 6D are sectional views showing a part of the manufacturing process for another modified stacked capacitor type dynamic RAM semiconductor device.

In FIG. 6A, a first contact hole 62 is selectively etched in the flattened first insulating layer 60 formed upon the source region 22a.

Figure 6B:
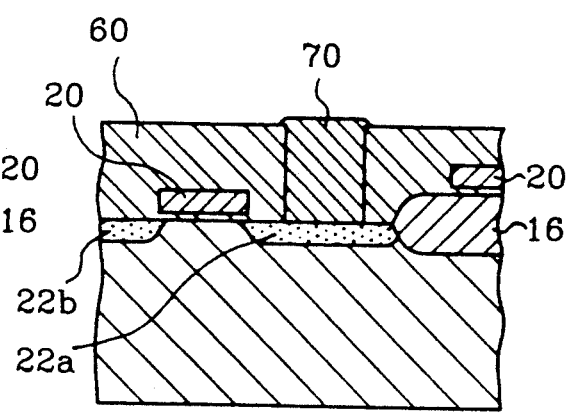

In FIG. 6B, an epitaxial layer 70 is grown up to the surface of the flattened layer 60 using the substrate surface of the exposed source region 22a as a seed.

Figure 6C:
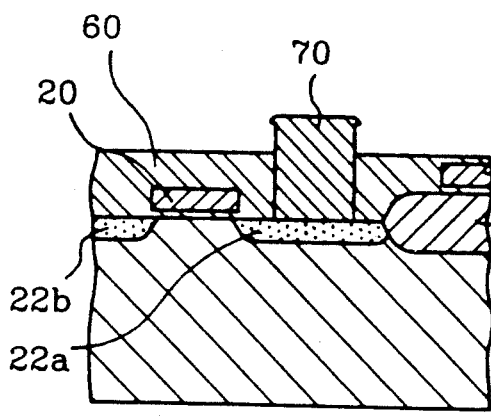

In FIG. 6C, the whole face of the first insulating layer 60 is etched a certain thickness by an etch-back process so that a part of the top of the epitaxial layer 70 is projected in a convex form.

Figure 6D:
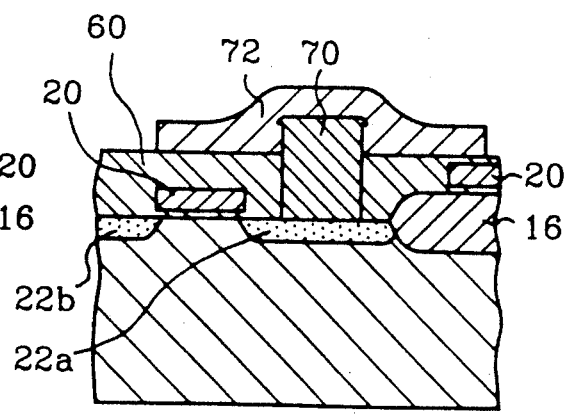

A second conductive layer 72 of a capacitor is formed on the projected epitaxial layer 70 and the first insulating layer 60 and has a pattern as shown in FIG. 6D.

In Examples I to IV described above, it should be understood that an epitaxial layer may be formed using the substrate surface of the exposed drain region 22b as a seed, after the formation of the second contact hole 38 on the drain region.

Further, second conductive layer 30 (i.e. the lower electrode of the capacitor) of FIGS. 3 and 4 can be formed almost simultaneously with the epitaxial layers 28, 52 by lowering the selection ratio during the growing of the epitaxial layers 28, 52 through the first contact hole 26.

According to the present invention as described above, an epitaxial layer is grown at the contact portion to prevent the deposition of defects of the polycrystalline silicon layer to the impurity doped region during the formation of a contact therebetween. Thus, the reliability of the semiconductor device is greatly enhanced while the contact size is reduced.

It is to be understood that the invention is not limited to the disclosed embodiments, but is intended to cover various modifications and equivalent arrangements included within the spirit and scope of the appended claims.

What is claimed is:

1. A method for manufacturing a dynamic RAM semiconductor device, comprising the steps of:
   selectively growing a field oxide layer on a surface of a first conduction type semiconductor substrate to define an active region;
   providing a gate oxide layer on said active region in a gate electrode pattern;
   forming a first conductive layer according to said gate electrode pattern;
   doping said active region of said semiconductor substrate with an impurity of a second conduction type using said gate electrode pattern and said field oxide layer as a mask;
   forming a first insulating layer on the whole surface of said semiconductor substrate;
   etching selectively said first insulating layer to expose a surface of said impurity-doped region in a first location, thereby forming a first contact hole;
   growing an epitaxial layer in said first contact hole using the exposed surface of said impurity-doped region in the first location as a seed;
   forming a second conductive layer upon said epitaxial layer;
   patterning said second conductive layer to form a lower electrode of a capacitor;
   forming a dielectric layer on said second conductive layer;
   forming a third conductive layer on said dielectric layer;
   patterning said third conductive layer to form an upper electrode of said capacitor; and
   forming a second insulating layer on said third conductive layer and said first insulating layer.

2. The method for manufacturing a dynamic RAM semiconductor device as claimed in claim 1, wherein said first to third conductive layers comprise polycrystalline silicon.

3. The method for manufacturing a dynamic RAM semiconductor device as claimed in claim 1, further comprising the step of growing an epitaxial layer within said second contact hole prior to forming said third conductive layer.

4. The method for manufacturing a dynamic RAM semiconductor device as claimed in claim 1, further comprising the step of lowering a selectivity during said epitaxial layer growing step, whereby said forming of the second conductive layer is simultaneous with said growing of the epitaxial layer.

5. A method for manufacturing a dynamic RAM semiconductor device, comprising the steps of:
   selectively growing a field oxide layer on a surface of a first conduction type semiconductor substrate to define an active region;
   providing a gate oxide layer on said active region in a gate electrode pattern;
   forming a first conductive layer according to the gate electrode pattern;
   forming a first insulating layer on the whole surface of said semiconductor substrate;
   etching selectively said first insulating layer to expose a surface of said impurity-doped region in a first location, thereby forming a first contact hole;
   etching said semiconductor substrate a certain depth through said first contact hole to form a trench;
   growing an epitaxial layer down to the interior of said first contact hole using an inside surface of said trench as a seed;
   forming a second conductive layer upon said epitaxial layer;
   patterning said second conductive layer to form a lower electrode of a capacitor;
   forming a dielectric layer on said second conductive layer;
   forming a third conductive layer on said dielectric layer;
   patterning said third conductive layer to form an upper electrode of said capacitor; and forming a second insulating layer on said third conductive layer and said first insulating layer.

6. The method for manufacturing a dynamic RAM semiconductor device as claimed in claim 5, wherein said first to third conductive layers comprise polycrystalline silicon.

7. The method for manufacturing a dynamic RAM semiconductor device as claimed in claim 5, further comprising the step of growing an epitaxial layer within said second contact hole prior to forming said fourth conductive layer.

8. The method for manufacturing a dynamic RAM semiconductor device as claimed in claim 5, further comprising the step of lowering a selectivity during the epitaxial layer growing step, whereby said forming of the second conductive layer is simultaneous with said growing of the epitaxial layer.

9. The method for manufacturing a dynamic RAM semiconductor device comprising the steps of:
   selectively growing a field oxide layer on the surface of a first conduction type semiconductor substrate to define an active region;
   providing a gate oxide layer on said active region in a gate electrode pattern;
   forming a first conductive layer according to said gate electrode pattern;
   doping said active region of said semiconductor substrate with an impurity of a second conduction type using said gate electrode pattern and said field oxide layer as a mask;
   forming a thick first insulating layer on the whole surface of said semiconductor substrate;
   etching selectively said first insulating layer to expose a surface of said impurity-doped region in a first location, thereby forming a first contact hole;
   growing an epitaxial layer in said first contact hole using the exposed surface of said impurity doped region in the first location as a seed;
   forming a second conductive layer on said epitaxial layer and said thick first insulating layer, wherein a central region of said second conductive layer over said epitaxial layer is depressed;
   patterning said second conductive layer to form a lower electrode of a capacitor;
   forming a dielectric layer on said second conductive layer;
   forming a third conductive layer on said dielectric layer;
   patterning said third conductive layer to form an upper electrode of said capacitor; and
   forming a second insulating layer on said third conductive layer and said first insulating layer.

10. The method for manufacturing a dynamic RAM semiconductor device as claimed in claim 9, wherein said first to third conductive layers comprise polycrystalline silicon.

11. The method for manufacturing a dynamic RAM semiconductor device as claimed in claim 9, wherein said first insulating layer comprises a BPSG layer.

12. A method for manufacturing a dynamic RAM semiconductor device, comprising the steps of:
   selectively growing a field oxide layer on a surface of a first conduction type semiconductor substrate to define an active region;
   providing a gate oxide layer on said active region in a gate electrode pattern;
   forming a first conductive layer according to said gate electrode pattern;
   doping said active region of said semiconductor substrate with an impurity of a second conduction type using said gate electrode pattern and said field oxide layer as a mask;
   forming a thick first insulating layer on the whole surface of said substrate;
   flattening said first insulating layer;
   etching selectively said first insulating layer to expose a surface of said impurity-doped region in a first location, thereby forming a first contact hole;
   growing an epitaxial layer is said first contact hole until at least level with said flattened first insulating layer, using the exposed surface of said impurity doped region in the first location as a seed;
   etching the whole face of said first insulating layer by a predetermined depth;
   forming a second conductive layer upon said epitaxial layer;
   patterning said second conductive layer to form a lower electrode of a capacitor, wherein a central portion of said second conductive layer projects upward over the epitaxial layer;
   forming a dielectric layer on said second conductive layer;
   forming a third conductive layer on said dielectric layer;
   patterning said third conductive layer to form an upper electrode of said capacitor; and
   forming a second insulating layer on said third conductive layer and said first insulating layer.

13. The method for manufacturing a dynamic RAM semiconductor device as claimed in claim 12, wherein said first to third conductive layers comprise polycrystalline silicon.

14. The method for manufacturing a dynamic RAM semiconductor device as claimed in claim 12, wherein said first insulating layer comprises a BPSG layer.

15. The method for manufacturing a dynamic RAM semiconductor device as claimed in claim 12, wherein said step of etching the whole face of said first insulating layer is performed by an etch-back process.

* * * * *